United States Patent
Yee et al.

(10) Patent No.: US 6,384,408 B1
(45) Date of Patent: May 7, 2002

(54) CALIBRATION OF A SCANNING ELECTRON MICROSCOPE

(75) Inventors: Jason C. Yee, San Jose; Laurence S. Hordon, Santa Clara; Weidong Liu, San Jose; David M. Goodstein, San Francisco, all of CA (US)

(73) Assignee: Kla-Tencor Corporation, San Jose, CA (US)

( * ) Notice: Subject to any disclaimer, the term of this patent is extended or adjusted under 35 U.S.C. 154(b) by 0 days.

(21) Appl. No.: 09/372,478

(22) Filed: Aug. 11, 1999

(51) Int. Cl.[7] .................................................. H01J 49/00
(52) U.S. Cl. .................. 250/252.1; 250/310; 250/491.1
(58) Field of Search .............................. 250/252.1, 310, 250/306, 307, 305, 491.1

(56) References Cited

U.S. PATENT DOCUMENTS 4,818,873 A * 4/1989 Herriot
4,938,600 A * 7/1990 Into ........................ 250/491.1
4,941,980 A * 7/1990 Havlavee et al.
5,155,359 A * 10/1992 Monahan

FOREIGN PATENT DOCUMENTS

EP          0314520      * 5/1989

OTHER PUBLICATIONS

"New Calibration Method for I.C. Dimensional Measurements", Bataillon J L et al., vol. ii, No. 1/04 Apr. 1, 1990 (1990–04–01), pp. 661–664.*

* cited by examiner

Primary Examiner—Kiet T. Nguyen
(74) Attorney, Agent, or Firm—Smyrski & Livesay, LLP

(57) ABSTRACT

A scanning electron microscope (SEM) is calibrated for the effects of local charging on a measured critical dimension (CD) of a wafer by first calibrating the microscope with respect to a calibration wafer with a known CD. Local charging on a wafer may be measured as a local landing energy (LLE) so that a scale factor based on a ratio of LLEs for the measurement wafer and a calibration wafer is used to correct a measured CD for the measurement wafer.

29 Claims, 4 Drawing Sheets

CALIBRATION OF A SCANNING ELECTRON MICROSCOPE

BACKGROUND OF THE INVENTION

1. Field of Invention

The present invention relates to a scanning electron microscope and more particularly to calibration of a scanning electron microscope to correct for the effects of local charging.

2. Description of Related Art

In the operation of a Scanning Electron Microscope (SEM), the incident electron beam can cause local charging (i.e., a buildup of charge) on the sample. Local charging, in turn, can influence the incident beam and significantly distort measurements taken by the SEM. The operation of an SEM requires the focussing of an incident electron beam onto a substrate. Backscattered electrons, as well as secondary electrons generated by the incident beam, are then collected for measurement purposes. By scanning the incident electron beam across a feature of interest and synchronously detecting the backscattered and secondary electrons, a measurement of the feature's size, known as a critical dimension (CD), can be obtained. A CD can be any characteristic feature to be measured. For example, a pitch CD denotes the repeat distance of a periodic structure such as a series of parallel lines.

The accuracy of a CD measurement is dependent on how accurately the SEM scanning operation can be calibrated. As illustrated in FIG. 4, an electron beam 61 is focussed onto a substrate such as a wafer 63. The actual distance covered on the substrate by the incident beam, which is known as the scan length, can be affected by the local electrostatic potential at the substrate surface. Under nominal conditions, the higher the local electrostatic potential, the shorter the scan length. Beam-induced local charging occurs when the number of electrons leaving the substrate (from backscattering and secondary electron generation) is different from the number entering it (from the incident beam). This affects the local electrostatic potential at the substrate surface, and thus the scan length. In FIG. 4 the absence of local charging leads to a scan length 65. When local charging is present on an area 67 of wafer 63, a resulting electric field 69 leads to a scan length 71 due to the change in the electrostatic potential.

This variation in the scan length due to local charging will lead to CD measurement inaccuracies since the scaling of distances depends on the scan length. That is, as the local charging varies, the ratio of a fixed CD to the scan length will correspondingly vary. This ratio provides a scaling that determines the CD measurement.

Thus, two wafers with identical features may lead to different scan lengths because of differences in local charging. Similarly, if the magnitude of local charging varies from substrate to substrate, the scan lengths will also vary. Compensating for these local-charging induced changes in scan length is necessary to maintain CD measurement accuracy across a wide variety of substrates and operating conditions.

Typically, the calibration of an SEM has been limited to an adjustment so that a measured CD matches a given value for the CD (e.g., U.S. Pat. No. 4,818,873). Correcting for errors associated with local charging has then generally been limited to parametric calibrations based on operational factors such as the composition of the substrate and the voltage levels used. That is, a different SEM calibration is required for each distinct operational setting and each type of substrate to account for the associated errors. This cumbersome approach requires considerable attention from a user in order to obtain a calibrated measurement. In addition, calibration to remove errors due to local charging is especially difficult to accomplish in operational settings exhibiting a high degree of sensitivity.

Calibration errors associated with local charging may also be difficult to detect since they are often not accompanied by any measurable change in image focus. However, the magnitude of these calibration errors in linear measurements may be on the order of 2–4% under nominal operating conditions, an error that is generally considered to be unacceptably large.

SUMMARY OF THE INVENTION

Accordingly, it is an object of this invention to provide a method and associated system for calibration of an SEM to correct for errors due to local charging.

It is a further object of this invention to provide a calibration of an SEM in a way that automatically accounts for variations in local charging.

It is a further object of this invention to provide a calibration for an SEM in a way that is simple and relatively transparent to the user.

It is still a further object of this invention to provide a calibration for an SEM by measuring the local landing energies to characterize the local charging for a calibration wafer and a measurement wafer.

It is another object of this invention to provide a calibration for an SEM by using measurements of local landing energies to extend the applicability of an SEM calibration.

The above and related objects of the present invention are realized by a system and method for calibrating a scanning electron microscope with respect to a calibration wafer, measuring a local landing energy of the calibration wafer with the microscope, measuring a critical dimension of the measurement wafer with the microscope, measuring a local landing energy of the measurement wafer with the microscope, and calculating the calibrated critical dimension of the measurement wafer.

Calibrating the microscope may be carried out by measuring a critical dimension of the calibration wafer, comparing the measured critical dimension of the calibration wafer to a reference critical dimension, and adjusting a scan calibration value of the microscope.

Measuring the local landing energy of a wafer may include determining the electrostatic potential at the substrate surface. In a preferred embodiment, measuring the local landing energy of a wafer includes measuring the energy of backscattered and/or generated secondary electrons.

Preferably, calculating the calibrated critical dimension of the measurement wafer includes scaling the measured critical dimension of the measurement wafer by a scaling factor, where the scaling factor is determined from the measured local landing energy of the calibration wafer and the measured local landing energy of the measurement wafer. The scaling factor may be used to determine a calibrated scan length for the microscope by scaling a reference scan length by the scaling factor.

The scaling factor may be determined by an evaluation of a scaling function for a ratio of the measured local landing energy of the measurement wafer with respect to the measured local landing energy of the calibration wafer. The scaling function is approximately one when the ratio is approximately one. The scaling function should have a simple structure such as a linear or a higher-order polynomial.

The present invention possesses a number of distinct advantages over known calibration systems. A correction for the effect of local charging on an SEM can be accomplished in a way that is simple and relatively transparent to the user. The LLE can be measured by in-line electron optics with relatively limited hardware additions to the basic SEM. The scaling of the measured CD of the measurement wafer is a relatively simple software operation. A scaling function with simple structure, such as a linear polynomial, can be tailored for this purpose.

This calibration tool provides an important enhancement to SEM technology since the effects of local charging on a CD measurement of a wafer may not be readily apparent to the user. Correcting for these errors without incorporating measurements of local charging as in the present invention may unavoidably require a difficult parametric calibration process.

These and other objects and advantages of the invention will become more apparent and more readily appreciated from the following detailed description of the presently preferred exemplary embodiment of the invention taken in conjunction with the accompanying drawings.

DETAILED DESCRIPTION OF THE PREFERRED EMBODIMENT

Figure 1:
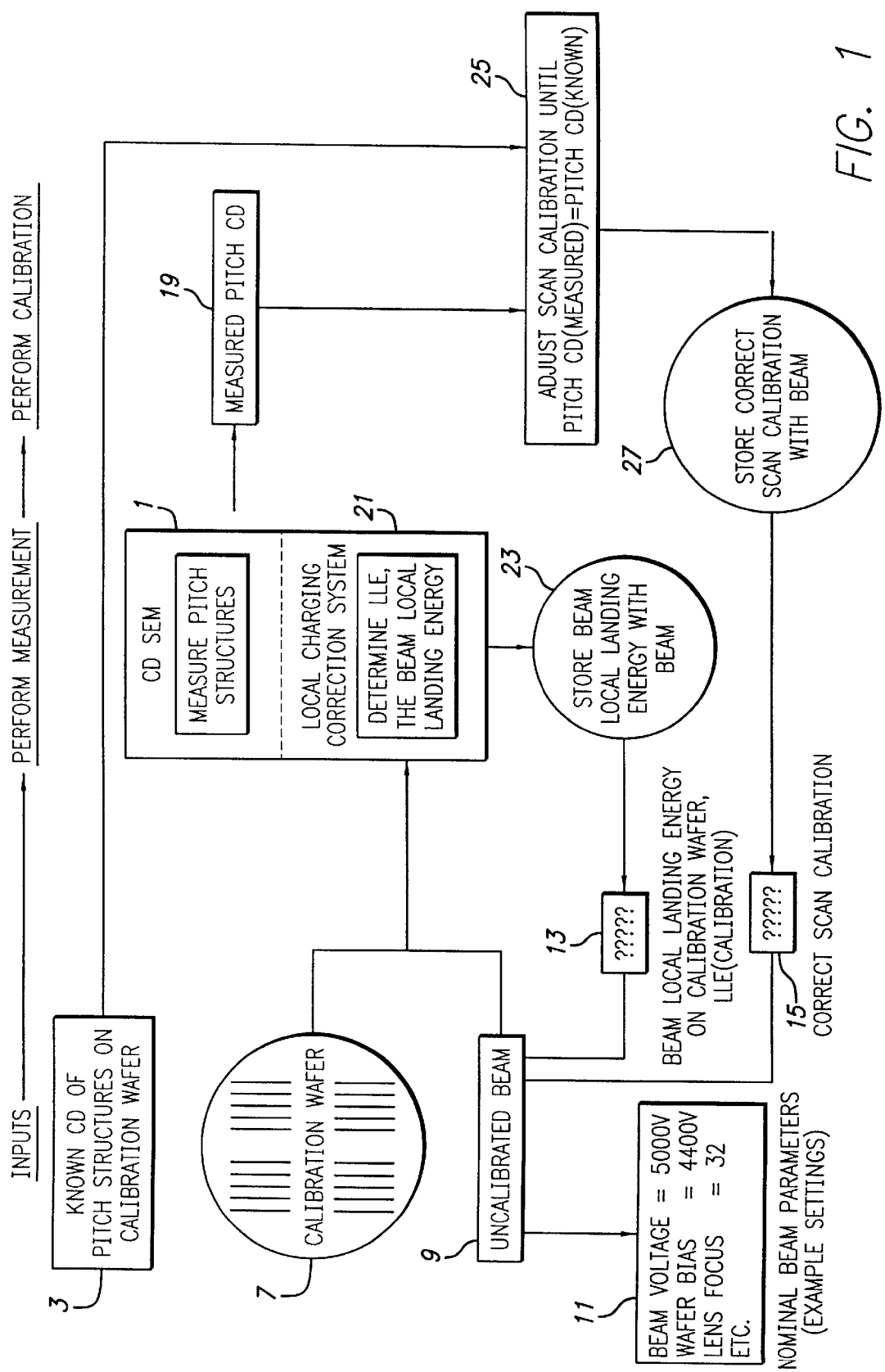
FIG. 1 is a diagram showing the calibration of an SEM to correct for local charging according to a preferred embodiment of the present invention.

The calibration of an SEM 1 according to a preferred embodiment of the present invention is illustrated in FIG. 1. By adjusting a scan calibration value 13 in a calibration mechanism (not shown), SEM 1 can be tuned so that a wafer with a known structure can be properly read. A calibration wafer 7 with a known Critical Dimension (CD) 3 of the pitch structure is used for this purpose.

In order to calibrate the microscope, measurements of calibration wafer 7 are taken using an uncalibrated beam 9 with nominal settings 11 but without values for scan calibration value 13. First, a measured pitch CD 19 is obtained. A calibration adjustment 25 then can be made so that, to within some acceptable tolerance, the measured pitch CD 19 is equal to the known reference value for the pitch CD 3. When the calibration is completed, an acceptable scan calibration value 27 is stored in memory 15. Then, a local charging correction system 21 obtains a measured local landing energy (LLE) 23, which is stored in memory 13, where the LLE is a characterization of the local charging on a wafer. The stored values for LLE 23 and scan calibration value 27 are then respectively available as inputs from memories 13 and 15.

Local charging changes the local surface potential, which directly determines the local landing energy. For example, in the absence of local charging, the surface potential at all points on the wafer may be zero volts and the landing energy of the electron beam may be 1000 electron volts (eV). If a small region of the wafer surface (possibly only microns in extent) begins to charge positively, the surface potential at a given point within this region might reach plus-fifty volts with respect to the rest of the wafer. The local landing energy of the electron beam at this point will now be 1000+50=1050 eV.

Figure 3:
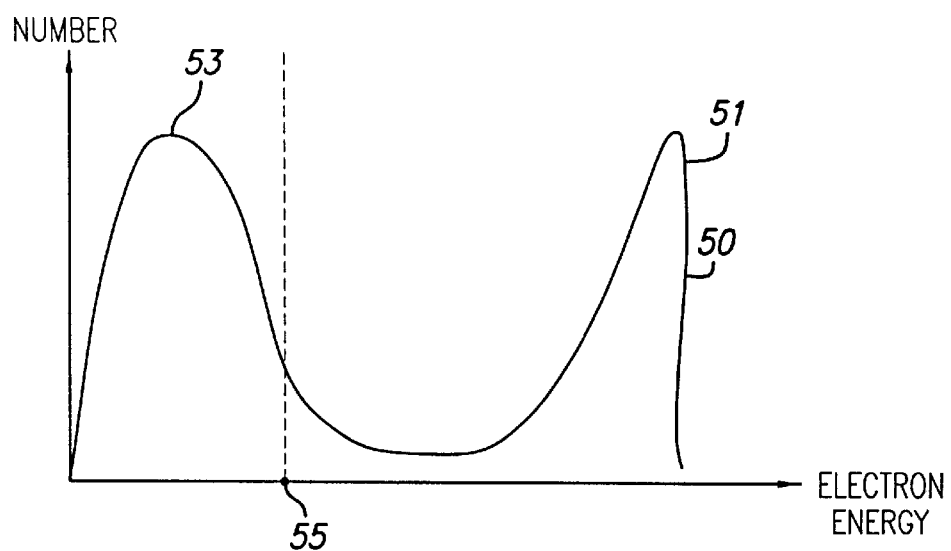
FIG. 3 is a plot showing the determination of a threshold energy for characterizing the local landing energy according to a preferred embodiment of the present invention.

According to a preferred embodiment, local charging correction system 21 determines the LLE, which is a characterization of the local charging on a wafer, by means of an energy filter that utilizes a potential barrier to measure the energies of electrons collected from the wafer being examined. As illustrated in FIG. 3, the distribution 50 of electrons is generically bimodal with contributions corresponding to backscattered electrons 51 and secondary electrons 53. A threshold energy 55 is determined as a relatively small voltage value where the effect of secondary electrons 53 is sufficiently diminished. Threshold value 55 is then converted to LLE value determined by local charging correction system 21. Qualitative details of the energy distribution illustrated in FIG. 3 may vary according to the composition of the wafer and the voltage levels used.

Threshold energy 55 may be characterized by the number of electrons relative to a peak value for secondary electrons 53 or by some characterization of the slope of distribution 50. For example, in a preferred embodiment, distribution 50 is first filtered to give a smoothed curve and then threshold 55 is determined as a voltage corresponding to a maximal slope of the smoothed curve.

As an alternative to the filter described above, any means for determining the energy spectrum of collected electrons may be employed. For example, a detection system that measures time-of-flight differences or flight path differences for electrons with different energies may be used. Other methods that directly or indirectly measure surface charge also may be used.

Figure 2:
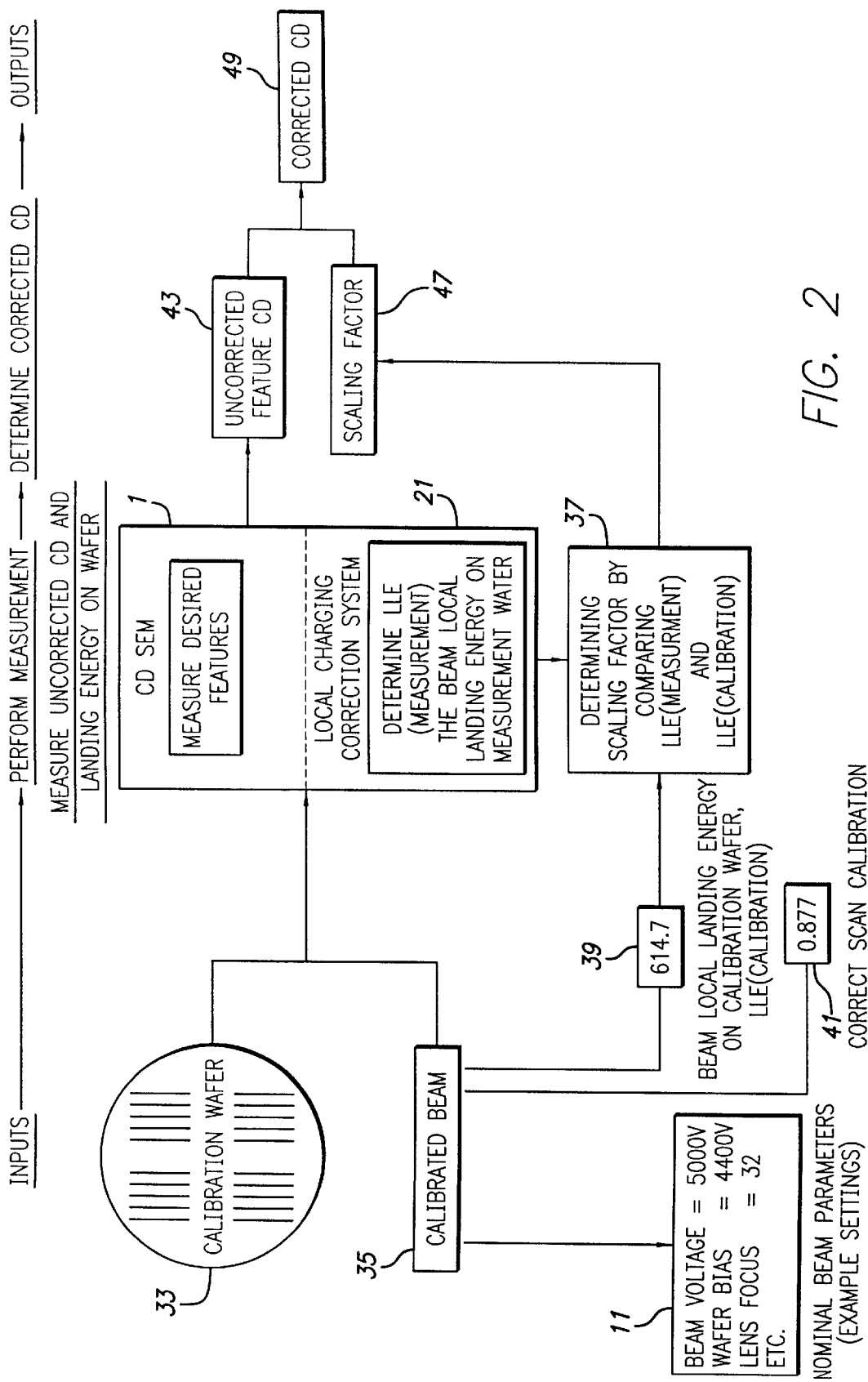
FIG. 2 is a diagram showing the use of a calibrated SEM to determine a corrected critical dimension according to a preferred embodiment of the present invention.

The corresponding operation of SEM 1 after calibration is illustrated in FIG. 2. A measurement wafer 33 is used in place of calibration wafer 7. Now calibrated beam 35 includes not only nominal beam parameters 11 but also stored values for the LLE of calibration wafer 39 and a scan calibration value 41. Calibrated SEM 1 first measures an uncorrected CD 43. Additionally, local charging correction system 21 measures a value for the LLE of measurement wafer 33. The LLE of measurement wafer 33 is then used with stored LLE 39 of calibration wafer 7 in a calculation 37 to determine a scaling factor 47. Scaling factor 47 is then multiplied with uncorrected CD 43 to give a value for a corrected CD 49.

According to a preferred embodiment, calculation 37 determines scaling factor 47 to obtain corrected CD 49 from uncorrected CD 43 according to the formula:

$$CD(\text{corrected})=CD(\text{uncorrected})*f(LLE(\text{measurement})/LLE(\text{calibration}))$$

where the scaling function f(.) is given by $$f(x)=1+0.25*(1-x)$$

Scaling function f(.) takes as its argument x, which is a ratio of the measured LLE for the measurement wafer with respect to the measured LLE for the calibration wafer. Other more complicated scaling functions are possible such a polynomial with higher-order terms. Numerical coefficients in the scaling function may be determined by operational conditions such as the composition of the wafer and the voltage levels. Preferably the value of the scaling function is one when the value of the ratio is one. That is, when the LLE does not change between the initial calibration and a subsequent measurement, it is unnecessary to scale the CD.

Figure 4:
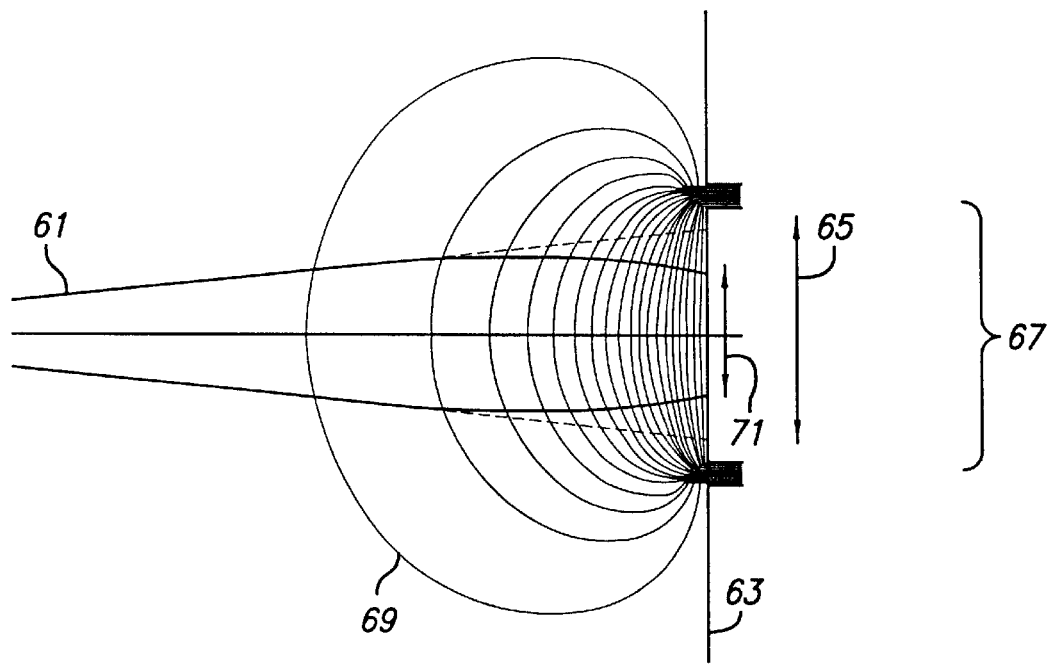
FIG. 4 is an illustration of the effect of local charging on the measured scan length and critical dimension of a wafer.

According to a preferred embodiment, the scaling function can be determined first by modeling the trajectories of electrons that characterize the scan length as illustrated in FIG. 4. The effect on a measured CD resulting from variations in local charging can then be characterized by a calculated scaling function that depends on a ratio of the local charging to a reference charging. The calculated scaling function is then verified experimentally and approximated more conveniently, for example, by a linear approximation as in the scaling function given above.

Figure 5:
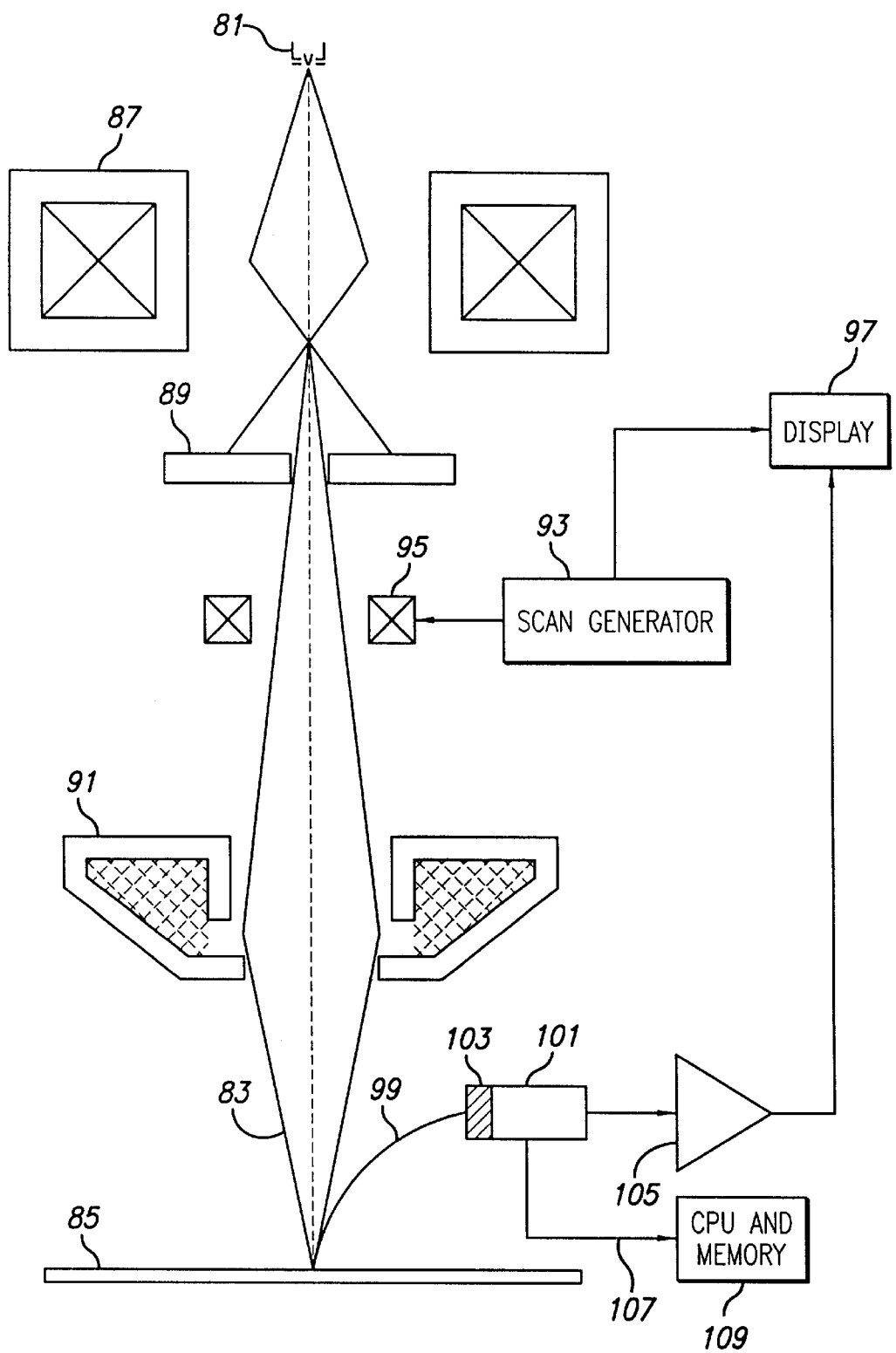
FIG. 5 is an illustration of an SEM adapted according to a preferred embodiment of the present invention.

An adaptation of an SEM according to a preferred embodiment of the present is illustrated in FIG. 5. The basic operation of an SEM is described in more detail in U.S. Pat. No. 4,818,873 (See FIG. 3 thereof). An electron source 81 directs an electron beam 83 to a target wafer 85. Beam 83 is focussed by SEM components including a condenser lens 87, an aperture 89 and an objective lens 91. A scan generator 93 drives a scan coil 95 and drives a display 97 with a consistent signal. Collected from wafer 85, a beam 99 of backscattered and secondary electrons is detected by a detector 101, amplified by an amplifier 105 and transmitted to display 97, where a CD can be displayed.

According to a preferred embodiment, detector 101 is adapted with an energy filter 103 that determines an LLE according to the thresholding illustrated FIG. 3. Thus, a signal 107 including both the LLE and the CD can be transmitted to a CPU and memory 109 where the calibration operation illustrated in FIGS. 3 and 4 is carried out.

In a second preferred embodiment, the results of the calibration operation may be used to correct the scanning operation in progress so that a desired scan length is measured directly. As illustrated in FIG. 4, scan length 65 is the desired scan length for operation of the SEM; however, when the SEM operates to make this measurement, scan length 71 is actually measured due to local charging. With the measurement of the LLE, the scaling function f(.) provides the scaling shown in FIG. 4 from scan length 65 without charging to scan length 71 with charging. This scaling result available in CPU and memory 109 is provided to scan generator 93 so that the desired scan length 65 is measured directly.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

What is claimed is:

1. A method for determining a calibrated critical dimension of a measurement wafer, comprising the steps of:
    calibrating a scanning electron microscope with respect to a calibration wafer;
    measuring a local landing energy of the calibration wafer with the microscope;
    measuring a critical dimension of the measurement wafer with the microscope;
    measuring a local landing energy of the measurement wafer with the microscope; and
    calculating the calibrated critical dimension of the measurement wafer.

2. A method as claimed in claim 1, wherein the step of calibrating the scanning electron microscope comprises the steps of:
    measuring a critical dimension of the calibration wafer;
    comparing the measured critical dimension of the calibration wafer to a reference critical dimension of the calibration wafer; and
    adjusting a scan calibration value of the microscope.

3. A method as claimed in claim 1, wherein the step of measuring the local landing energy of the calibration wafer comprises the steps of:
    measuring an electron energy distribution for the calibration wafer; and
    determining a threshold energy value for the calibration wafer.

4. A method as claimed in claim 1, wherein the step of measuring the local landing energy of the measurement wafer comprises the steps of:
    measuring an electron energy distribution for the measurement wafer; and
    determining a threshold energy value for the measurement wafer.

5. A method as claimed in claim 1, wherein the step of calculating the calibrated critical dimension of the measurement wafer comprises scaling the measured critical dimension of the measurement wafer by a scaling factor, wherein the scaling factor is determined from the measured local landing energy of the measurement wafer and the measured local landing energy of the calibration wafer.

6. A method as claimed in claim 5, wherein a reference scan length for the microscope is scaled by the scaling factor to give a calibrated scan length.

7. A method as claimed in claim 5, wherein the scaling factor is determined by an evaluation of a scaling function for a ratio of the measured local landing energy of the measurement wafer with respect to the measured local landing energy of the calibration wafer.

8. A method as claimed in claim 7, wherein the scaling function is approximately one when the ratio is approximately one.

9. A method as claimed in claim 7, wherein the scaling function is a polynomial.

10. A method as claimed in claim 7, wherein the scaling function is a linear polynomial having a zeroth-order coefficient and a first-order coefficient, wherein
    the zeroth-order coefficient is approximately 1.25, and
    the first-order coefficient is approximately −0.25.

11. A system for determining a calibrated critical dimension of a measurement wafer, comprising:
    a scanning electron microscope;
    a first sensor for measuring a critical dimension of a wafer;
    a second sensor for measuring a local landing energy of a wafer; and
    an adjustment mechanism for calibrating the microscope according to a scan calibration value.

12. A system as claimed in claim 11, further comprising:
    a first memory for storing a scan calibration value associated with a calibration wafer;
    a second memory for storing a measured local landing energy of the calibration wafer;
    a third memory for storing a measured local landing energy of the measurement wafer;

a fourth memory for storing a measured critical dimension of the measurement wafer;

a processor for calculating the calibrated critical dimension of the measurement wafer; and a fifth memory for storing the calibrated critical dimension of the measurement wafer.

13. A system as claimed in claim 11, wherein the microscope is calibrated by measuring a critical dimension of the calibration wafer with the first sensor;

comparing the measured critical dimension of the calibration wafer to a reference critical dimension of the calibration wafer; and changing the scan calibration value in the adjustment mechanism.

14. A system as claimed in claim 11, wherein measuring a local landing energy of a wafer comprises:

measuring an electron energy distribution for the wafer; and determining a threshold energy value for the wafer.

15. A system as claimed in claim 11, wherein determining the calibrated critical dimension of the measurement wafer comprises scaling the measured critical dimension of the measurement wafer by a scaling factor, wherein the scaling factor is determined from measurement wafer measured local landing energy and measured local landing energy of a calibration wafer.

16. A system as claimed in claim 15, wherein a calibrated scan length for the microscope is determined by scaling a reference scan length by the scaling factor.

17. A system as claimed in claim 15, wherein the scaling factor is determined by an evaluation of a scaling function for a ratio of the measured local landing energy of the measurement wafer with respect to the measured local landing energy of the calibration wafer.

18. A system as claimed in claim 17, wherein the scaling function is approximately one when the ratio is approximately one.

19. A system as claimed in claim 17, wherein the scaling function is a polynomial.

20. A system as claimed in claim 17, wherein the scaling function is a linear polynomial having a zeroth-order coefficient and a first-order coefficient, wherein the zeorth-order coefficient is approximately 1.25, and the first-order coefficient is approximately −0.25.

21. An apparatus for determining a calibrated critical dimension of a measurement wafer, comprising:

means for measuring a critical dimension of a wafer;

means for measuring a local landing energy of a wafer;

means for calibrating the critical-dimension measuring means;

means for storing a measured local landing energy of a calibration wafer;

means for storing a measured local landing energy of the measurement wafer;

means for storing a measured critical dimension of the measurement wafer;

means for calculating the calibrated critical dimension of the measurement wafer; and means for storing the calibrated critical dimension of the measurement wafer.

22. An apparatus as claimed in claim 21, wherein the calibrating means includes:

means for comparing a measured critical dimension of the calibration wafer to a reference critical dimension of the calibration wafer; and means for storing a scan calibration value associated with a calibration wafer.

23. An apparatus as claimed in claim 21, wherein the means for measuring a local landing energy of the calibration wafer includes:

means for measuring an electron energy distribution for the calibration wafer; and means for determining a threshold energy value for the calibration wafer.

24. An apparatus as claimed in claim 21, wherein the means for calculating the calibrated critical dimension of the measurement wafer includes means for scaling the measured critical dimension of the measurement wafer by a scaling factor, wherein the scaling factor is determined from the measured local landing energy of the measurement wafer and the measured local landing energy of the calibration wafer.

25. An apparatus as claimed in claim 24, wherein the means for measuring a critical dimension of a wafer includes means for determining a calibrated scan length by scaling a reference scan length by scaling a reference scan length by the scaling factor.

26. An apparatus as claimed in claim 24, wherein the scaling factor is determined by an evaluation of a scaling function for a ratio of the measured local landing energy of the measurement wafer with respect to the measured local landing energy of the calibration wafer.

27. An apparatus as claimed in claim 26, wherein the scaling function is approximately one when the ratio is approximately one.

28. An apparatus as claimed in claim 26, wherein the scaling function is a polynomial.

29. An apparatus as claimed in claim 26, wherein the scaling function is a linear polynomial having a zeroth-order coefficient and a first-order coefficient, wherein the zeorth-order coefficient is approximately 1.25, and the first-order coefficient is approximately −0.25.

* * * * *